US010043709B2

(12) United States Patent
Ai et al.

(10) Patent No.: US 10,043,709 B2
(45) Date of Patent: Aug. 7, 2018

(54) METHODS FOR THERMALLY FORMING A SELECTIVE COBALT LAYER

(71) Applicant: APPLIED MATERIALS, INC., Santa Clara, CA (US)

(72) Inventors: Hua Ai, Tracy, CA (US); Jiang Lu, Milpitas, CA (US); Avgerinos V. Gelatos, Scotts Valley, CA (US); Paul F. Ma, Santa Clara, CA (US); Sang Ho Yu, Cupertino, CA (US); Feng Q. Liu, San Jose, CA (US); Xinyu Fu, Pleasanton, CA (US); Weifeng Ye, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/931,417

(22) Filed: Nov. 3, 2015

(65) Prior Publication Data
US 2016/0133563 A1 May 12, 2016

Related U.S. Application Data

(60) Provisional application No. 62/076,872, filed on Nov. 7, 2014.

(51) Int. Cl.
*H01L 21/768* (2006.01)
*C23C 16/06* (2006.01)
(Continued)

(52) U.S. Cl.
CPC ........ *H01L 21/76879* (2013.01); *C23C 16/04* (2013.01); *C23C 16/06* (2013.01);
(Continued)

(58) Field of Classification Search
CPC .......... H01L 23/5226; H01L 21/76825; H01L 21/76826; H01L 21/76828;
(Continued)

(56) References Cited

U.S. PATENT DOCUMENTS 6,096,644 A  8/2000 Lukanc
6,559,026 B1  5/2003 Rossman et al.
(Continued)

FOREIGN PATENT DOCUMENTS

JP  2014-101564 A  6/2014

OTHER PUBLICATIONS

U.S. Appl. No. 14/802,275, filed Jul. 17, 2015, Trivedi et al.
(Continued)

*Primary Examiner* — Fernando L Toledo
*Assistant Examiner* — Neil Prasad
(74) *Attorney, Agent, or Firm* — Moser Taboada; Alan Taboada

(57) ABSTRACT

Methods for selectively depositing a cobalt layer are provided herein. In some embodiments, methods for selectively depositing a cobalt layer include: exposing a substrate to a first process gas to passivate an exposed dielectric surface, wherein the substrate comprises a dielectric layer having an exposed dielectric surface and a metal layer having an exposed metal surface; and selectively depositing a cobalt layer atop the exposed metal surface using a thermal deposition process.

19 Claims, 5 Drawing Sheets

(51) Int. Cl.
*H01L 21/285* (2006.01)
*C23C 16/04* (2006.01)
*H01L 23/532* (2006.01)

(52) U.S. Cl.
CPC .. *H01L 21/28562* (2013.01); *H01L 21/76814* (2013.01); *H01L 21/76826* (2013.01); *H01L 21/76849* (2013.01); *H01L 21/76834* (2013.01); *H01L 21/76883* (2013.01); *H01L 23/53209* (2013.01); *H01L 23/53238* (2013.01); *H01L 23/53266* (2013.01); *H01L 2924/0002* (2013.01)

(58) Field of Classification Search
CPC ........... H01L 21/76843; H01L 21/7685; H01L 21/76879; H01L 23/53238
See application file for complete search history.

(56) References Cited

U.S. PATENT DOCUMENTS

| | | | |
|---|---|---|---|
| 7,687,913 | B2 | 3/2010 | Chakrapani et al. |
| 8,021,980 | B2 | 9/2011 | Kim et al. |
| 8,476,162 | B2 | 7/2013 | Ha et al. |
| 8,637,390 | B2 | 1/2014 | Ganguli et al. |
| 9,209,073 | B2 | 12/2015 | Yang et al. |
| 2002/0029958 | A1 | 3/2002 | Chiang et al. |
| 2002/0192396 | A1 | 12/2002 | Wang et al. |
| 2003/0045098 | A1* | 3/2003 | Verhaverbeke ... H01L 21/67069 438/689 |
| 2005/0170650 | A1 | 8/2005 | Fang et al. |
| 2005/0280118 | A1 | 12/2005 | Lin et al. |
| 2006/0251801 | A1 | 11/2006 | Weidman et al. |
| 2006/0252252 | A1* | 11/2006 | Zhu ......................... B82Y 30/00 438/618 |
| 2007/0202254 | A1* | 8/2007 | Ganguli ................. C23C 16/18 427/252 |
| 2008/0265416 | A1* | 10/2008 | Lee ..................... H01L 21/3212 257/751 |
| 2009/0269507 | A1 | 10/2009 | Yu et al. |
| 2010/0081275 | A1 | 4/2010 | Ishizaka et al. |
| 2010/0291321 | A1* | 11/2010 | Mallikarjunan ........ C23C 16/36 427/579 |
| 2012/0012465 | A1 | 1/2012 | Kim et al. |
| 2012/0252207 | A1* | 10/2012 | Lei .................... H01L 21/76885 438/653 |
| 2013/0273729 | A1 | 10/2013 | Hempel et al. |
| 2014/0004717 | A1 | 1/2014 | Chan et al. |
| 2014/0183742 | A1* | 7/2014 | Matsumoto ....... H01L 23/53266 257/751 |
| 2015/0140233 | A1 | 5/2015 | Zope et al. |
| 2015/0203961 | A1 | 7/2015 | Ha et al. |
| 2015/0262828 | A1 | 9/2015 | Brand et al. |
| 2015/0380296 | A1* | 12/2015 | Antonelli .......... H01L 21/76883 438/643 |
| 2016/0035619 | A1 | 2/2016 | Yu et al. |

OTHER PUBLICATIONS

U.S. Appl. No. 14/815,156, filed Jul. 31, 2015, Yu et al.
International Search Report and Written Opinion dated Feb. 17, 2016 for PCT Application No. PCT/US2015/059221.

* cited by examiner

US 10,043,709 B2

METHODS FOR THERMALLY FORMING A SELECTIVE COBALT LAYER

CROSS-REFERENCE TO RELATED APPLICATIONS

This application claims benefit of U.S. provisional patent application Ser. No. 62/076,872, filed Nov. 7, 2014, which is herein incorporated by reference in its entirety.

FIELD

Embodiments of the present disclosure generally relate to methods of selectively depositing a cobalt layer on a substrate.

BACKGROUND

In the formation of metal interconnects, for example copper interconnects, depositing a cobalt capping layer between the copper interconnect and the subsequently formed dielectric barrier layer improves the adhesion between the metal and the dielectric and the reliability of the interface between the metal and the dielectric portions. However, the inventors have observed that typical cobalt deposition processes are plasma deposition process utilizing precursors that require a plasma process. The inventors have observed that such a plasma process results in damage to surrounding dielectric materials, for example dielectric materials having a low dielectric constant.

Accordingly, the inventors have developed improved techniques to selectively deposit a cobalt layer on a substrate.

SUMMARY

Methods for selectively depositing a cobalt layer are provided herein. In some embodiments, methods for selectively depositing a cobalt layer include: exposing a substrate to a first process gas to passivate an exposed dielectric surface, wherein the substrate comprises a dielectric layer having an exposed dielectric surface and a metal layer having an exposed metal surface; and selectively depositing a cobalt layer atop the exposed metal surface using a thermal deposition process.

In some embodiments, methods for selectively depositing a cobalt layer include exposing a substrate, comprising a dielectric layer having an exposed dielectric surface and a metal layer having an exposed metal surface, to a reducing gas at a temperature of about 200 to about 800 degrees Celsius, or to a plasma formed from a reducing gas, or to a UV light activated reducing gas to remove contaminants from the copper surface and from the dielectric surface; exposing the substrate to a first process gas to passivate the exposed dielectric surface and improve the dielectric constant of the dielectric layer by about 1 percent to about 10 percent; selectively depositing a cobalt layer atop the metal surface using a thermal deposition process; and exposing the substrate to the first process gas after selectively depositing the cobalt layer to improve the dielectric constant of the exposed dielectric layer by about 1 percent to about 10 percent.

In some embodiments, a computer readable medium, having instructions stored thereon which, when executed, cause a process chamber to perform a method for selectively depositing a cobalt layer. The method may include any of the embodiments disclosed herein Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
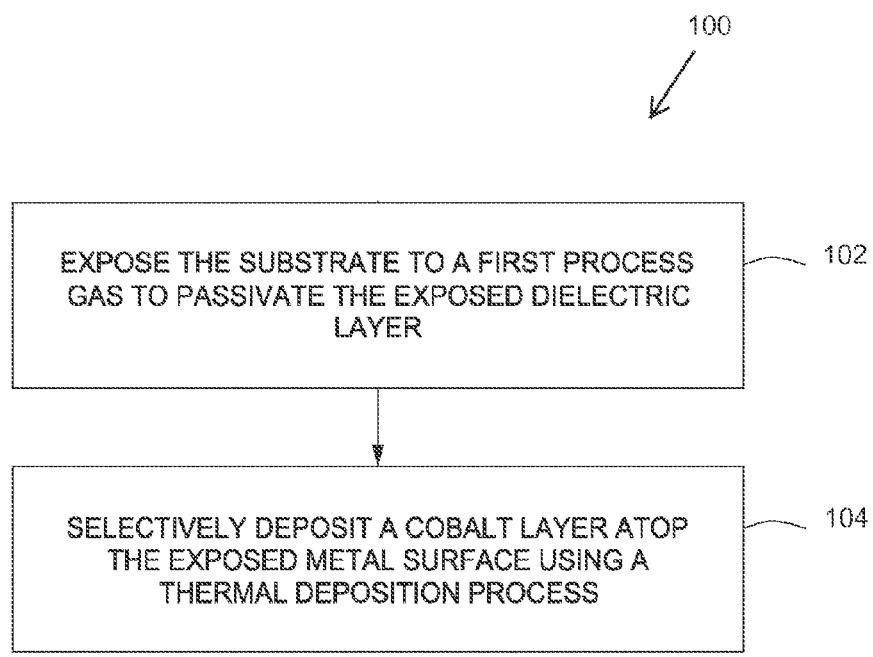
FIG. 1 depicts a flow chart of a method for selectively depositing a cobalt layer in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for selectively depositing a cobalt layer are provided herein. The inventive methods advantageously provide the selective deposition of a cobalt capping layer onto a metal interconnect, for example a copper interconnect, using a thermal deposition process to avoid damage to surrounding dielectric material having a low dielectric constant. The inventive methods may be utilized in the formation of metal interconnects in an integrated circuit, or in the formation of a metal gate or a metal-contact gap fill process, as well as other suitable applications utilizing selectively deposited cobalt layers.

FIG. 1 depicts a flow chart of a method 100 for selectively depositing a cobalt layer in accordance with some embodiments of the present disclosure. The method 100 is described below with respect to the stages of selectively depositing a cobalt capping layer as depicted in FIGS. 2A-2E and may be performed, for example, in a suitable reactor, such as is described below with respect to FIG. 3.

The method 100 begins by providing a substrate 200 to a process chamber, such as is described below with respect to FIG. 3. The substrate 200 may be any suitable substrate having one or more feature 216. For example, the substrate 200 may comprise one or more of silicon (Si), silicon oxide ($SiO_2$), or the like. In addition, the substrate 200 may include additional layers of materials or may have one or more completed or partially completed structures.

Figure 2A:
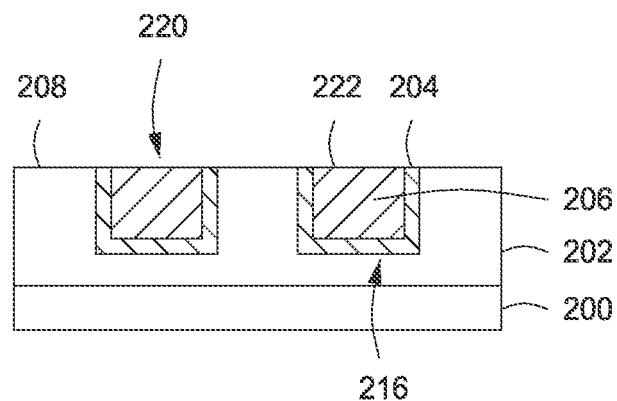
FIGS. 2A-E depicts the stages of selectively depositing a cobalt layer in accordance with some embodiments of the present disclosure.

In some embodiments, as depicted in FIG. 2A, the substrate 200 includes a dielectric layer 202 disposed on the substrate 200. The dielectric layer 202 comprises a dielectric surface 208 having one or more feature 216 formed in the dielectric surface 208. The dielectric layer 202 contains a dielectric material, such as silicon oxide ($SiO_2$), silicon nitride (SiN), a low-k material, or the like. In some embodiments, the low-k material may be carbon-doped dielectric materials (such as carbon-doped silicon oxide (SiOC), BLACK DIAMOND® dielectric material available from Applied Materials, Inc. of Santa Clara, Calif., or the like), an organic polymer (such as polyimide, parylene, or the like), organic doped silicon glass (OSG), fluorine doped silicon glass (FSG), or the like. As used herein, low-k materials are materials having a dielectric constant of about 2.2 to about 3, and more specifically about 2.4 to about 2.8. The feature 216 comprises an opening 220 formed in the dielectric surface 208 of the dielectric layer 202 and extending into the dielectric layer 202, away from the dielectric surface 208 and towards an opposing second surface of the dielectric layer 202. The opening 220 may be any suitable opening such as a via, trench, dual damascene structure, or the like. The opening 220 may be formed by etching the dielectric layer using any suitable etch process.

In some embodiments, a barrier layer 204 is deposited within the opening 220 using any suitable deposition process, for example, a physical vapor deposition process, a chemical vapor deposition process, or an atomic layer deposition process. The barrier layer 204 may serve as an electrical and/or physical barrier between the dielectric layer 202 and a metal-containing layer to be subsequently deposited in the opening, and/or may function as a better surface for attachment during the subsequent deposition of a metal-containing layer than a native surface of the substrate. In some embodiments, the barrier layer 204 may have any suitable thickness to function as a barrier layer, for example, within a range from about 5 angstroms to about 50 angstroms. The barrier layer 204 may contain titanium, titanium nitride, tantalum, tantalum nitride, tungsten, tungsten nitride, derivatives thereof, or combinations thereof. In some embodiments, the barrier layer 204 may contain a tantalum/tantalum nitride bilayer or titanium/titanium nitride bilayer.

In some embodiments, following the formation of the barrier layer 204, the opening 220 may be filled with a conductive (i.e. metal) material, such as copper, tungsten, titanium nitride, cobalt or the like. The metal layer 206 may be deposited using any suitable metal deposition process known in the art, for example a physical vapor deposition process, a chemical vapor deposition process, an electrochemical plating process or the like. In some embodiments, a polishing process, such as a chemical mechanical polishing process may subsequently be performed to remove excess metal material and barrier layer material from the dielectric surface 208 of the dielectric layer 202.

In some embodiments, the polishing process may result in the formation of contaminants on the exposed metal surface 222 of the metal layer 206 and the dielectric surface 208 of the dielectric layer 202. For example, where the metal layer 206 is copper, contaminants usually contain copper oxides formed during or after the polishing process. The exposed metal surfaces 222 of the metal layer 206 may be oxidized by peroxides, water, or other reagents in the polishing solution or by oxygen within the ambient air. Contaminants may also include moisture, polishing solution remnants including surfactants and other additives, or particles of polished away materials. Contaminants may be removed by exposing the substrate to a cleaning process where the contaminants are exposed to a reducing gas. In some embodiments, the substrate may be exposed to the reducing gas prior to, or concurrent with exposing the substrate to the first process gas 210 at 102 below. In some embodiments, the reducing gas includes hydrogen (e.g., $H_2$ or atomic-H), ammonia ($NH_3$), a hydrogen and ammonia mixture ($H_2$/$NH_3$), atomic-N, hydrazine ($N_2H_4$), alcohols (e.g., methanol, ethanol, or propanol), derivatives thereof, plasmas thereof, or combinations thereof. In some embodiments, the substrate 200 may be exposed to the reducing gas in a thermal process or in a plasma process. For example, in a thermal process, the substrate 200 may be exposed to the reducing gas and heated to temperature of about 200 degrees Celsius to about 800 degrees Celsius for about 2 minutes to about 20 minutes. For example, in a plasma process, the substrate 200 can be exposed to a reducing gas and heated to a temperature of about 100 degrees Celsius to about 400 degrees Celsius. The substrate may be exposed to a plasma, generated at a power of about 200 watts to about 1000 watts, for about 2 seconds to about 60 seconds. In some embodiments, the substrate is also exposed to the reducing gas and simultaneously to a UV light source in order to activate the reducing gas. The UV light source may be of any wavelength sufficient to activate the reducing gas. In some embodiments, the UV light may have a wavelength of about 100 nm to about 400 nm, or more specifically about 180 nm to about 200 nm.

Figure 2B:
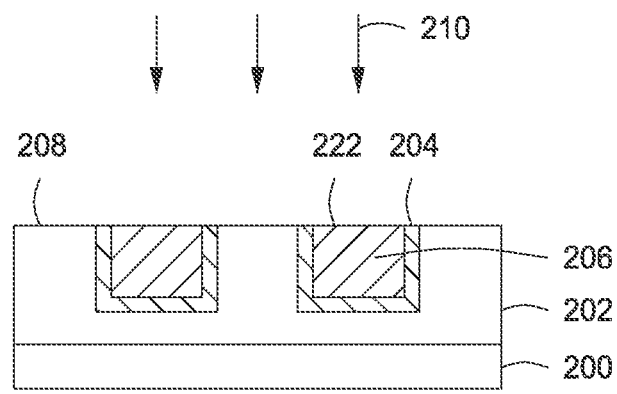

At 102, and as depicted in FIG. 2B, the substrate 200 is exposed to a first process gas 210. The first process gas 210 passivates the dielectric surface 208 of the dielectric layer 202, allowing the subsequent selective deposition of cobalt as described at 104 below. The inventors have also observed that exposing the substrate to the first process gas 210 also advantageously repairs damage (i.e., an increase in the the dielectric constant) to the low-k material of the dielectric layer 202 caused by prior processes discussed above, such as polishing or cleaning. Specifically, the inventors have observed that exposing the substrate 200 to the first process gas 210 improves (i.e. reduces) the dielectric constant of the damaged dielectric layer 202 by about 1 percent to about 10 percent. In some embodiments, the first process gas may comprise a silane containing compound, such as bis(dimethylamino)dimethylsilane, dimethlaminotrimethylsilane, 1-(trimethylsilyl)-1H-pyrrole, chlorotrimethylsilane or a combination thereof. In some embodiments, the first process gas 210 may comprise alcohols such as ethanol, propanol, butanol, or the like. In some embodiments, the first process gas may comprise a vinyl silane containing compound. Exemplary vinyl silane containing compounds may be of the formula:

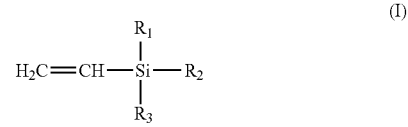

R1, R2, and R3 are each individually selected from hydrogen (H), alkyl groups (e.g., methyl, ethyl, propyl, butyl, etc.), alkoxy groups (e.g., methoxy, ethoxy, propoxy etc.), chlorine, and vinyl groups. Other substituted vinyl silanes also fall within the implementations described herein. Exemplary vinyl silanes include vinyl silane, trimethylvinylsilane (TMVS), vinyltrichlorosilane, vinyltrimethoxysilane, vinyltriethoxysilane, vinyltris(2-methoxyethoxy)silane, vinyltrisisopropoxysilane, vinyltris(tert-butylperoxy)silane, vinyldimethylchlorosilane, vinyldimethylethoxysilane, vinylmethyldichlorosilane, vinylmethyldimethoxysilane, vinylmethyldiethoxysilane, methylvinyldi(n-methylacetylamido)silane, methylvinyldi (5-caprolactam)silane, bis(methyldichlorosilyl)ethane, and combinations thereof. In one implementation, the vinyl silane containing compound is trimethylvinylsilane (TMVS).

In some embodiments, the substrate 200 is exposed to the first process gas 210 at a temperature of about 25 degrees Celsius to about 400 degrees Celsius. For example, in some embodiments, as discussed below, where the method 100 is performed in a single apparatus, the substrate is exposed to the first process gas 210 at a temperature of about 250 degrees Celsius to about 350 degrees Celsius. In some embodiments, where 102 is performed in one apparatus and 104, as described below, is performed in a second apparatus, the substrate 200 is exposed to the first process gas 210 at a temperature of about 25 degrees Celsius to about 400 degrees Celsius. In some embodiments, the substrate is exposed to the first process gas 210 for about 10 to about 300 seconds, for example about 10 to about 60 seconds. In some embodiments, the flow rate of the first process gas 210 to the process chamber is about 10 sccm to about 1000 sccm, for example about 50 sccm to about 400 sccm. In some embodiments, the substrate is exposed to the first process gas 210 at an apparatus pressure of about 1 to about 100 Torr. In some embodiments, the first process gas 210 further comprises hydrogen gas ($H_2$) and an inert gas, such as argon, helium, krypton or the like.

Figure 2C:
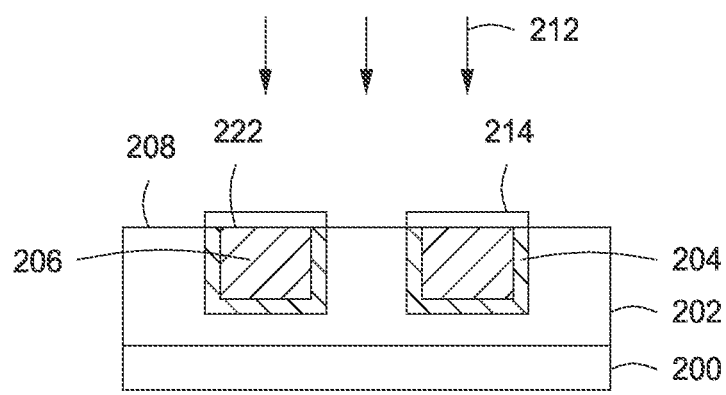

At 104, as depicted in FIG. 2C, a cobalt layer 214 is selectively deposited atop the exposed metal surface 222 of the metal layer 206 while leaving the dielectric surface 208 of the dielectric layer 202 free or substantially free of cobalt formation. The cobalt layer 214 is deposited by exposing the substrate 200 to a cobalt precursor gas 212. The cobalt layer 214 is formed by the thermal deposition of the cobalt precursor gas 212 in the process chamber 302 via a suitable thermal deposition process, for example a thermal chemical vapor deposition process or thermal atomic layer deposition process. In some embodiments, the substrate is exposed to the cobalt precursor gas 212 at a temperature suitable for thermal deposition, for example at a temperature of about 200 degrees Celsius to about 400 degrees Celsius. In some embodiments, the cobalt precursor gas 212 may be provided to the process chamber 302 as described below along with a carrier gas, for example an inert gas, such as argon, helium, nitrogen or the like. In some embodiments, suitable reactant gases that may be provided to the process chamber 302 that are useful to forming cobalt material include hydrogen, ammonia, nitrogen, argon and combinations thereof.

The cobalt precursor gas 212 is a gas suitable for thermal deposition. For example, in some embodiments, suitable cobalt precursor gases include: cobalt carbonyl complexes, cobalt dienyl complexes, cobalt nitrosyl complexes, derivatives thereof, complexes thereof, plasma thereof, or combinations thereof. In some embodiments, cobalt carbonyl compounds or complexes may be utilized as cobalt precursors. Cobalt carbonyl compounds or complexes have the general chemical formula $(CO)_xCo_yL_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L is absent, one ligand or multiple ligands, that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, bytylacetylene, nitrosyl, ammonia, derivatives thereof, complexes thereof, plasma thereof, or combinations thereof. Some exemplary cobalt carbonyl complexes include cyclopentadienyl cobalt bis(carbonyl) ($CpCo(CO)_2$), tricarbonyl allyl cobalt (($CO)_3Co(CH_2CH=CH_2)$), dicobalt hexacarbonyl bytylacetylene (CCTBA, $(CO)_6Co_2(HC\equiv CtBu)$), dicobalt hexacarbonyl methylbytylacetylene ($(CO)_6Co_2(MeC\equiv CtBu)$), dicobalt hexacarbonyl phenylacetylene ($(CO)_6Co_2(HC\equiv CPh)$), dicobalt hexacarbonyl methylphenylacetylene ($(CO)_6Co_2(MeC\equiv CPh)$), dicobalt hexacarbonyl methylacetylene ($(CO)_6Co_2(HC\equiv CMe)$), dicobalt hexacarbonyl dimethylacetylene ($(CO)_6Co_2(MeC\equiv CMe)$), derivatives thereof, complexes thereof, plasma thereof, or combinations thereof.

In some embodiments, cobalt amido complexes may be utilized as cobalt precursors. Cobalt amido complexes have the general chemical formula $(RR'N)_xCo$, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amido complexes include bis(di(butyldimethylsilyl)amido)cobalt ($((BuMe_2Si)_2N)_2Co$), bis(di(ethyidimethylsilyl)amido)cobalt ($((EtMe_2Si)_2N)_2Co$), bis(di(propyidimethylsilyl)amido)cobalt ($((PrMe_2Si)_2N)_2Co$), bis(di(trimethylsilyl)amido)cobalt ($((Me_3Si)_2N)_2Co$), tris(di(trimethylsilyl)amido)cobalt ($((Me_3Si)_2N)_3Co$), derivatives thereof, complexes thereof, plasma thereof, or combinations thereof.

In some embodiments, the cobalt precursor gas 212 is a cobalt amidinate complex. The cobalt amidinate complexes have the formula:

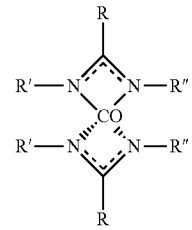

R' = $^t$Bu, R'' = $^t$Bu, R = Me
R' = $^i$Pr, R'' = $^i$Pr, R = Me
R' = $^t$Bu, R'' = Et. R = $^n$Bu
R' = $^t$Bu, R'' = $^t$Bu R = Et
R' = $^t$Bu, R'' = Et, R = Me

Examples of suitable cobalt amidinates include cobalt bis(N,N'-di-t-butylacetamidinate), cobalt bis(N,N'-diisopropylacetamidinate), cobalt bis(N-t-butyl-N'-ethylacetamidinate), cobalt bis(N-N'-di-t-butyl-propanoamidinate), and cobalt bis(N-t-butyl-N'-ethylbutanoamidinate).

In some embodiments, the cobalt precursor gas 212 is the bis(1,4-di-tert-butyl-1,3-diazabutadienyl)cobalt(II) family of chemicals. The bis(1,4-di-tert-butyl-1,3-diazabutadienyl)cobalt(II) complexes have the formula:

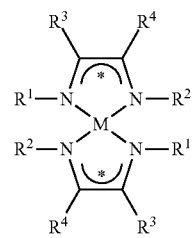

where $R^1$ is one of t-butyl, isopropyl, or isobutyl; $R^2$ is one of t-butyl, or isopropyl; $R^3$ is one of hydrogen, methyl, or ethyl; and $R^4$ is one of hydrogen, methyl, or ethyl.

Some exemplary cobalt precursors include methylcyclopentadienyl cobalt bis(carbonyl) (MeCpCo(CO)$_2$), ethylcyclopentadienyl cobalt bis(carbonyl) (EtCpCo(CO)$_2$), pentamethylcyclopentadienyl cobalt bis(carbonyl) (Me$_5$CpCo(CO)$_2$), dicobalt octa(carbonyl) (CO$_2$(CO)$_8$), nitrosyl cobalt tris(carbonyl) ((ON)Co(CO)$_3$), bis(cyclopentadienyl)cobalt, (cyclopentadienyl)cobalt(cyclohexadienyl), cyclopentadienyl cobalt(1,3-hexadienyl), (cyclobutadienyl)cobalt(cyclopentadienyl), bis(methylcyclopentadienyl)cobalt, (cyclopentadienyl)cobalt(5-methylcyclopentadienyl), bis(ethylene)cobalt(pentamethylcyclopentadienyl), cobalt tetracarbonyl iodide, cobalt tetracarbonyl trichlorosilane, carbonyl chloride tris(trimethylphosphine)cobalt, cobalt tricarbonyl-hydrotributylphosphine, acetylene dicobalt hexacarbonyl, acetylene dicobalt pentacarbonyl triethylphosphine, derivatives thereof, complexes thereof, plasma thereof, or combinations thereof.

In some embodiments, the ratio of the rate of cobalt deposition on the exposed metal surface 222 to the rate of cobalt deposition on the exposed dielectric surface 208 is about 200:1 to about 3000:1. In some embodiments, the thickness of the cobalt layer 214 is about 10 angstroms to about 40 angstroms. In some embodiments, an inert gas, for example, argon, helium, krypton, or the like, is supplied to the process chamber along with the cobalt precursor gas.

The inventors have observed that selectively depositing a cobalt layer using a plasma deposition process results in damage to the low-k material of the dielectric layer. As a result, the method 100 described herein advantageously treats the dielectric layer 202 with a first process gas 210 using a thermal deposition process and can selectively deposit the cobalt layer 214 using only a thermal deposition process.

Figure 2D:
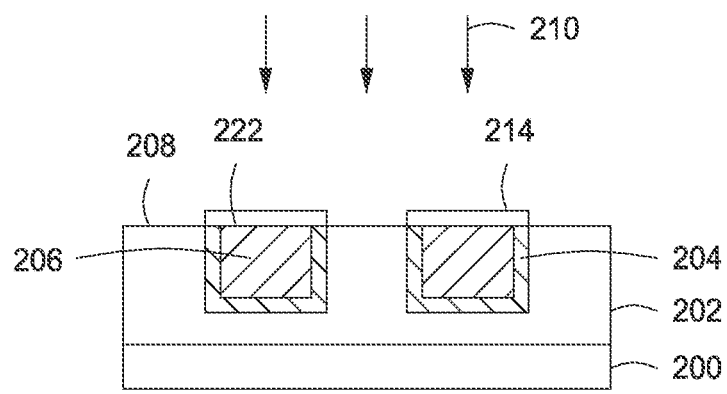

Optionally, as depicted in FIG. 2D, the substrate 200 may again be exposed to the first process gas 210, as described above, to further repair damage (i.e. an increase in the dielectric constant) to the low-k material of the dielectric layer 202 caused by prior processes discussed above or any additional processes performed after forming the cobalt layer 214. Specifically, the inventors have observed that again exposing the substrate 200 to the first process gas 210 further improves (i.e. reduces) the dielectric constant of the damaged dielectric layer 202 by about 1 percent to about 10 percent. In some embodiments, the substrate may again be exposed to the first process gas 210 at the process conditions discussed above at 102 or at different process conditions. For example, in some embodiments, the substrate is again exposed to the first process gas 210 for about 10 to about 300 seconds, for example about 60 to about 300 seconds. In some embodiments, the flow rate of the first process gas 210 to the process chamber is about 10 sccm to about 1000 sccm, for example about 50 sccm to about 1000 sccm.

Following selective deposition of the cobalt layer or, optionally, further exposure to the first process gas 210, the method 100 generally ends and the substrate 200 may proceed for further processing. In some embodiments, subsequent processes such as deposition, etch, annealing, or the like may be performed to fabricate a finished device.

Figure 2E:
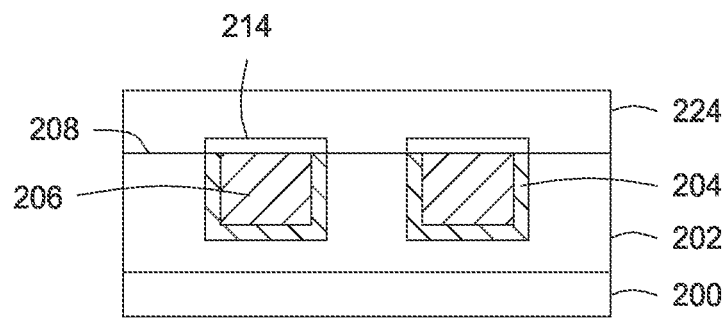

In some embodiments, as depicted in FIG. 2E, a dielectric barrier layer 224 of, for example, a low-k dielectric material as described above may be deposited over the cobalt layer 214 and the dielectric surface 208 of the dielectric layer 202.

Figure 4A:
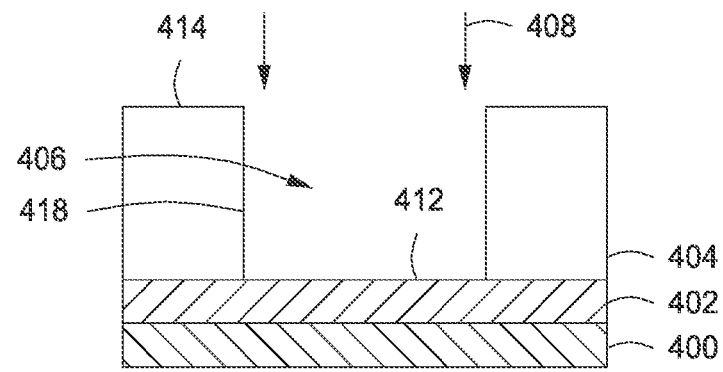
FIGS. 4A-4D respectively depict stages of selectively depositing a cobalt layer in accordance with some embodiments of the present disclosure.

In some embodiments, depending on the structure of the device formed, 102-104 may be repeated to deposit the cobalt layer to a predetermined thickness. For example, FIG. 4A depicts a substrate 400, similar to the substrate 200 described above, having a metal layer 402 disposed on the substrate 400. The metal layer 402 may be copper, tungsten, titanium nitride, cobalt or the like. One or more dielectric layers 404 may be disposed atop the metal layer 402. The dielectric layer 404 may be a low-k material as described above.

In some embodiments, a patterned mask layer (not shown) may be formed atop the dielectric layer 404 to etch a feature 406 into the dielectric layer 404 to the surface of the metal layer 402. The patterned mask layer may be any suitable mask layer such as a hard mask or photoresist layer. The patterned mask layer may be formed by any process suitable to form a patterned mask layer capable of providing an adequate template for defining a pattern in the underlying dielectric layer 404. For example, in some embodiments, the patterned mask layer may be formed via a patterned etch process.

In some embodiments, the feature 406 may be a trench or a via. The feature 406 may be etched via any etching process suitable for etching a dielectric material to form a feature 406 having vertical or substantially vertical sidewalls. For example, the substrate 400 may be exposed to an etching plasma formed using a halogen containing gas, for example a fluorine-containing gas.

Figure 4B:
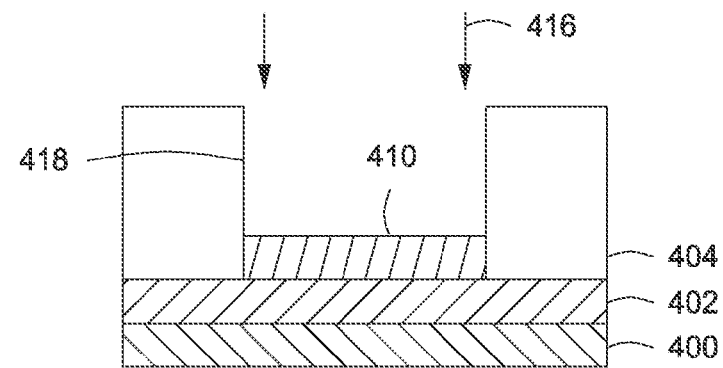
Figure 4C:
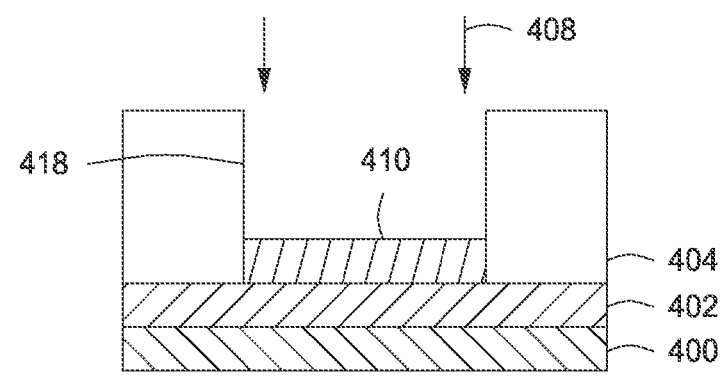
Figure 4D:
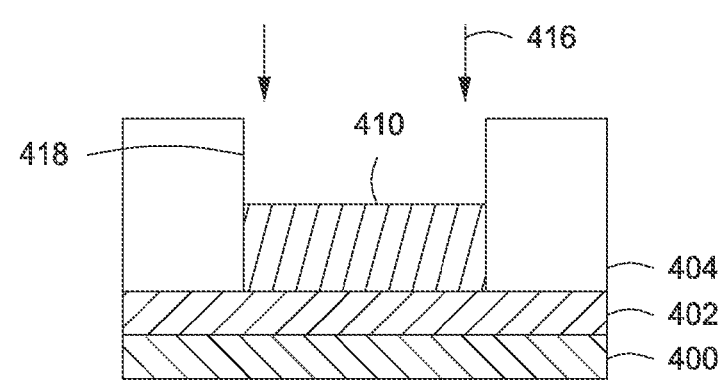

As described above with respect to 102, and depicted in FIG. 4A, the substrate 400 may be exposed to a first process gas 408 to passivate the exposed dielectric surface 414 and the sidewalls 418 to prevent cobalt formation on the dielectric layer 404 and to repair damage to the dielectric layer 404 from prior processes, such as the etching process. Next, as described above with respect to 104 and depicted in FIG. 4B, a cobalt layer 410 is selectively deposited atop the exposed metal surface 412 of the metal layer 402 while leaving the dielectric surface 414 and the sidewalls 418 of the dielectric layer 404 free or substantially free of cobalt formation. The cobalt layer 410 is deposited via the cobalt precursor gases 416 and process conditions described above. In some embodiments, as depicted in FIGS. 4C and 4D, depending on the depth of the feature 406, 102-104 can be repeated to deposit the cobalt layer 410 to a predetermined thickness, for example to fill the feature 406 without the formation of a void in the feature 406.

Figure 3:
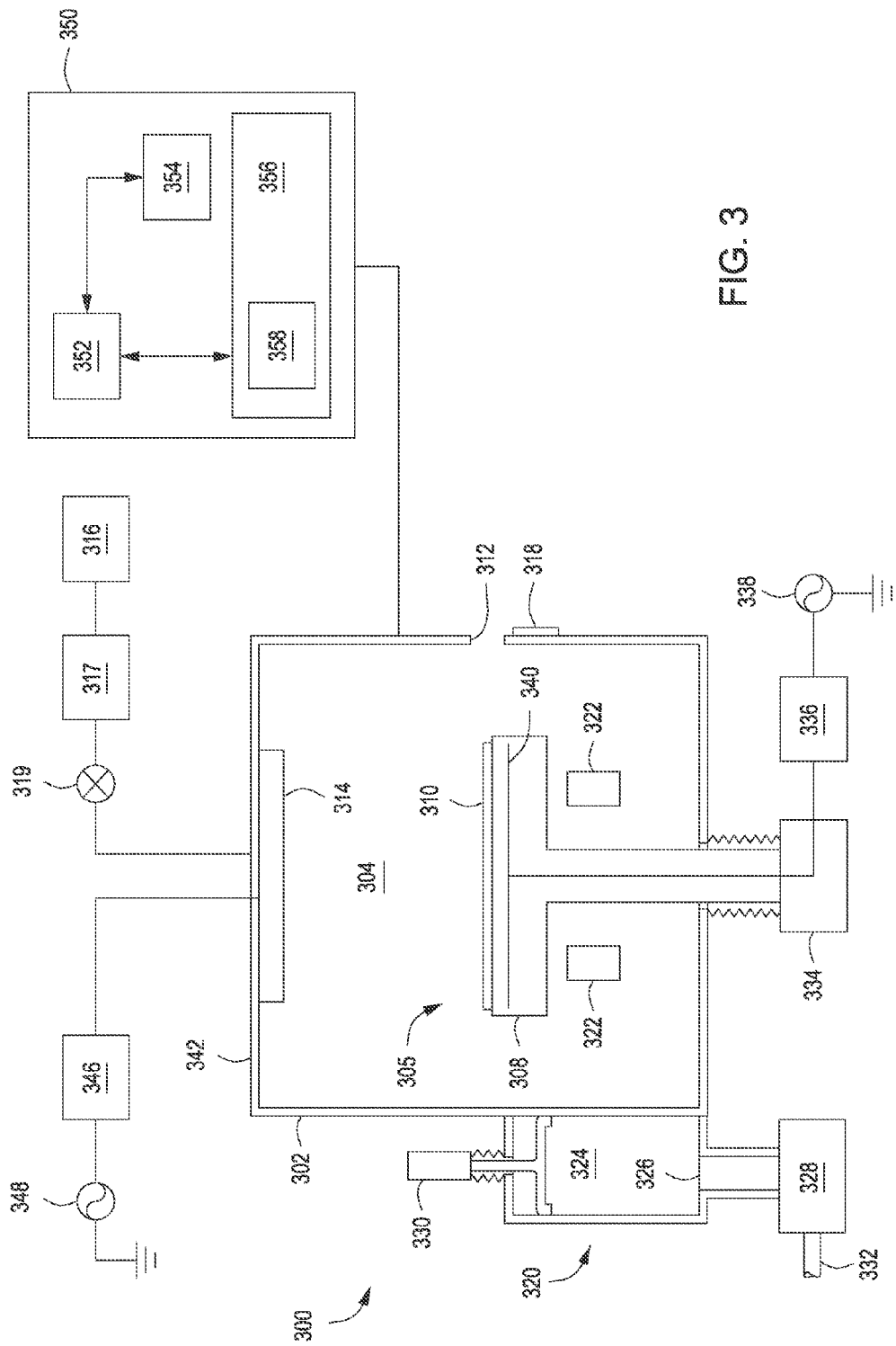
FIG. 3 depicts a process chamber suitable for performing a method of selectively depositing a cobalt layer in accordance with some embodiments of the present disclosure.

FIG. 3 depicts a schematic diagram of an illustrative apparatus 300 of the kind that may be used to practice embodiments of the disclosure as discussed herein. The apparatus 300 may be any apparatus suitable for performing one or more substrate processes, for example but not limited to, deposition process such as chemical vapor deposition (CVD), atomic layer deposition (ALD), or the like. In some embodiments the process chamber 302 may be a standalone apparatus 300, as depicted below, or a the process chamber 302 may be part of a cluster tool, such as one of the CENTURA®, PRODUCER®, or ENDURA® cluster tools available from Applied Materials, Inc. of Santa Clara, Calif. For example, in some embodiments, the removal of contaminants on the exposed metal surface 222 of the metal layer 206 and the dielectric surface 208 of the dielectric layer 202 and exposure of the substrate 200 to the first process gas 210 at 102 may be performed in a single process chamber 302 coupled to a cluster tool while the selective deposition of cobalt as described at 104 is performed in a different process chamber 302 coupled to the cluster tool. In some embodiments, 102 and 104 may be performed in a single process chamber 302 coupled to a cluster tool while the removal of contaminants on the exposed metal surface 222 of the metal layer 206 and the dielectric surface 208 of the dielectric layer 202 is performed in a different process chamber coupled to the cluster tool.

The apparatus 300 may comprise a controller 350 and a process chamber 302 having an exhaust system 320 for removing excess process gases, processing by-products, or the like, from the inner volume 305 of the process chamber 302. Exemplary process chambers may include any of several process chambers configured for chemical vapor deposition (CVD) or atomic layer deposition (ALD), available from Applied Materials, Inc. of Santa Clara, Calif. Other suitable process chambers from other manufacturers may similarly be used.

The process chamber 302 has an inner volume 305 that may include a processing volume 304. The processing volume 304 may be defined, for example, between a substrate support 308 disposed within the process chamber 302 for supporting a substrate 310 thereupon during processing and one or more gas inlets, such as a showerhead 314 and/or nozzles provided at predetermined locations. In some embodiments, the substrate support 308 may include a mechanism that retains or supports the substrate 310 on the surface of the substrate support 308, such as an electrostatic chuck, a vacuum chuck, a substrate retaining clamp, or the like (not shown). In some embodiments, the substrate support 308 may include mechanisms for controlling the substrate temperature (such as heating and/or cooling devices, not shown) and/or for controlling the species flux and/or ion energy proximate the substrate surface.

For example, in some embodiments, the substrate support 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 1200 W or RF energy at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. The at least one bias power source may provide either continuous or pulsed power. In some embodiments, the bias power source alternatively may be a DC or pulsed DC source.

The substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support 308 may be coupled to a lift mechanism 334 that may control the position of the substrate support 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at predetermined flow rates at a constant flow rate, or pulsed (as described above).

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support, or the like.

The apparatus 300 may utilize capacitively coupled RF energy for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 3,000 W, or in some embodiments, up to about 5,000 W, of RF energy at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support 308. The software routine 358, when executed by the CPU 352, transforms the general purpose computer into a specific purpose computer (controller) 350 that controls the chamber operation such that the methods disclosed herein are performed.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of selectively depositing a cobalt layer, comprising:
   (a) exposing a substrate to a first process gas to passivate an exposed dielectric surface, wherein the substrate comprises a dielectric layer having an exposed dielectric surface and a metal layer having an exposed metal surface, wherein the first process gas comprises a silane containing compound, a vinyl silane containing compound, or alcohols;
   (b) selectively depositing a cobalt layer atop the exposed metal surface using a thermal deposition process; and
   (c) exposing the substrate to the first process gas after selectively depositing the cobalt layer to reduce a dielectric constant of the dielectric layer, wherein the first process gas is a passivating gas.

2. The method of claim 1, further comprising, prior to exposing the substrate to the first process gas, exposing the substrate to a reducing gas at a temperature of about 200 to about 800 degrees Celsius, exposing the substrate to a plasma formed from a reducing gas, or exposing the substrate to a UV light activated reducing gas, to remove contaminants from the exposed metal surface and exposed dielectric surface, wherein the first process gas is a passivating gas.

3. The method of claim 2, wherein the reducing gas comprises nitrogen, ammonia, hydrogen, or alcohols.

4. The method of claim 1, wherein the first process gas further comprises hydrogen gas ($H_2$) and an inert gas.

5. The method of claim 1, wherein the substrate is exposed to the first process gas at a temperature of about 25 degrees Celsius to about 400 degrees Celsius.

6. The method of claim 1, wherein exposing the substrate to the first process gas before selectively depositing the cobalt layer reduces the dielectric constant of the dielectric layer by about 1 percent to about 10 percent.

7. The method of claim 1, wherein selectively depositing the cobalt layer further comprises exposing the substrate to a cobalt precursor gas.

8. The method of claim 7, wherein the cobalt precursor gas is a cobalt carbonyl complex, a cobalt dienyl complex, or a cobalt nitrosyl complex.

9. The method of claim 1, wherein the cobalt layer is selectively deposited at a temperature of about 200 degrees Celsius to about 400 degrees Celsius.

10. The method of claim 1, wherein a ratio of a cobalt deposition rate on the exposed metal surface to a cobalt deposition rate on the exposed dielectric surface is about 200:1 to about 3000:1.

11. The method of claim 1, wherein exposing the substrate to the first process gas after selectively depositing the cobalt layer reduces a dielectric constant of the dielectric layer by about 1 percent to about 10 percent.

12. The method of claim 1, wherein the dielectric layer is a low-k dielectric layer having a dielectric constant of about 2.2 to about 3.

13. The method of claim 1, wherein the metal layer is copper, tungsten, titanium nitride, or cobalt.

14. The method of claim 1, further comprising repeating (a)-(b) to form the cobalt layer to a predetermined thickness.

15. A method of selectively depositing a cobalt layer, comprising:
    exposing a substrate, comprising a dielectric layer having an exposed dielectric surface and a metal layer having an exposed metal surface, to a reducing gas at a temperature of about 200 to about 800 degrees Celsius, or to a plasma formed from a reducing gas, or to a UV light activated reducing gas to remove contaminants from the metal surface and from the dielectric surface;
    exposing the substrate to a first process gas to passivate the exposed dielectric surface and reduce a dielectric constant of the dielectric layer by about 1 percent to about 10 percent, wherein the first process gas comprises a silane containing compound, a vinyl silane containing compound, or alcohols;
    selectively depositing a cobalt layer atop the metal surface using a thermal deposition process; and
    exposing the substrate to the first process gas after selectively depositing the cobalt layer to reduce the dielectric constant of the dielectric layer by about 1 percent to about 10 percent.

16. The method of claim 1, wherein the silane containing compound is at least one of bis(dimethylamino)dimethylsilane, dimethlaminotrimethylsilane, 1-(trimethylsilyl)-1H-pyrrole, or chlorotrimethylsilane.

17. The method of claim 1, further comprising depositing a barrier layer on the exposed dielectric surface prior to depositing the metal layer.

18. A method of selectively depositing a cobalt layer for forming a void-free feature, comprising:
    (a) exposing a substrate having a metal layer disposed on the substrate to a first process gas;
    (b) disposing a dielectric layer on the metal layer;
    (c) etching a feature into the dielectric layer, the metal layer having an exposed surface;
    (d) exposing the feature in the dielectric layer to a first process gas to passivate an exposed surface of the dielectric surface, the first process gas comprising a silane containing compound, a vinyl silane containing compound, or alcohols;
    (e) exposing the substrate having the metal layer disposed thereon to a cobalt precursor gas, selectively depositing a cobalt layer atop the exposed metal surface using a thermal deposition process; and
    (f) repeating (d)-(e) to deposit the cobalt layer to a pre-determined thickness or to fill the feature.

19. The method of claim 18, further comprising, prior to exposing the substrate to the first process gas concurrent with exposing the substrate to a reducing gas at a temperature of about 200 to about 800 degrees Celsius to activate the reducing gas to remove contaminants from the exposed metal surface and the exposed dielectric surface.

* * * * *

UNITED STATES PATENT AND TRADEMARK OFFICE
CERTIFICATE OF CORRECTION

PATENT NO. : 10,043,709 B2
APPLICATION NO. : 14/931417
DATED : August 7, 2018
INVENTOR(S) : Ai et al.

It is certified that error appears in the above-identified patent and that said Letters Patent is hereby corrected as shown below:

Column 12, in Claim 16, delete "trimethylsilyi" and substitute therefor --trimethylsilyl--.

Signed and Sealed this
Eighteenth Day of September, 2018

Andrei Iancu
*Director of the United States Patent and Trademark Office*